(12) United States Patent
Jadhav

(10) Patent No.: US 10,382,287 B2
(45) Date of Patent: Aug. 13, 2019

(54) PERSISTENT NODE FRAMEWORK

(71) Applicant: Ajay Jadhav, New York, NY (US)

(72) Inventor: Ajay Jadhav, New York, NY (US)

(*) Notice: Subject to any disclaimer, the term of this patent is extended or adjusted under 35 U.S.C. 154(b) by 932 days.

(21) Appl. No.: 14/379,905

(22) PCT Filed: Feb. 25, 2013

(86) PCT No.: PCT/US2013/027584
§ 371 (c)(1),
(2) Date: Aug. 20, 2014

(87) PCT Pub. No.: WO2013/126868
PCT Pub. Date: Aug. 29, 2013

(65) Prior Publication Data
US 2015/0033135 A1    Jan. 29, 2015

Related U.S. Application Data

(60) Provisional application No. 61/602,241, filed on Feb. 23, 2012.

(51) Int. Cl.
*G06T 11/20* (2006.01)
*H04L 12/24* (2006.01)
*G06F 15/16* (2006.01)
*G06F 17/50* (2006.01)
*G06F 3/0484* (2013.01)
(Continued)

(52) U.S. Cl.
CPC ............ *H04L 41/22* (2013.01); *G06F 3/0484* (2013.01); *G06F 9/4493* (2018.02); *G06F 15/16* (2013.01); *G06F 16/972* (2019.01); *G06F 17/5004* (2013.01)

(58) Field of Classification Search
None
See application file for complete search history.

(56) References Cited

U.S. PATENT DOCUMENTS 5,949,425 A * 9/1999 Willis ................. G06T 17/20
345/423
6,803,912 B1 * 10/2004 Mark .................. G06T 15/00
345/427

(Continued)

FOREIGN PATENT DOCUMENTS

JP         H06290015 A    10/1994

OTHER PUBLICATIONS

Extended European Search Report, dated Sep. 30, 2015, issued in related European Application No. 13752031.8, filed Feb. 25, 2013.
(Continued)

*Primary Examiner* — Anh-Tuan V Nguyen
(74) *Attorney, Agent, or Firm* — Wiley Rein, LLP

(57) ABSTRACT

A node framework capable of rendering any aspect of a computer model with persistence onto a graphical rendering surface of a computing device is disclosed. Initially, a plurality of nodes are received, where each of the plurality of nodes is associated with a payload, at one of the plurality of nodes is a persistent node, and another of the plurality of nodes has a predefined relationship with the persistent node. Next, the payload associated with each of the plurality of nodes extracted. Finally, display of information based on the extracted payload associated with each of the plurality of nodes is enabled.

17 Claims, 9 Drawing Sheets

(51) Int. Cl.
*G06F 9/448* (2018.01)
*G06F 16/958* (2019.01)

(56) References Cited

U.S. PATENT DOCUMENTS

| | | | | |
|---|---|---|---|---|
| 7,269,796 B1* | 9/2007 | Bayes | ............... | G06F 17/30554 707/E17.032 |
| 7,290,216 B1* | 10/2007 | Kawahara | ............... | G06F 9/451 715/762 |
| 7,295,119 B2* | 11/2007 | Rappaport | ............ | G06F 17/509 340/5.8 |
| 8,253,730 B1* | 8/2012 | Carr | ..................... | G06T 17/005 345/419 |
| 8,779,921 B1* | 7/2014 | Curtiss | ................ | G08B 25/009 340/506 |
| 8,953,889 B1* | 2/2015 | Worley, III | ....... | G06F 17/30489 382/103 |
| 8,957,757 B1* | 2/2015 | Le Burge | .......... | G07C 9/00007 340/5.22 |
| 2004/0177093 A1 | 9/2004 | Mullins | | |
| 2004/0189645 A1* | 9/2004 | Beda | ........................ | G06F 8/38 345/473 |
| 2005/0035970 A1* | 2/2005 | Wirtschafter | ........ | G11B 27/034 345/473 |
| 2006/0136575 A1* | 6/2006 | Payne | ................ | G07C 9/00087 709/219 |
| 2006/0176403 A1* | 8/2006 | Gritton | ................ | G06F 3/0481 348/581 |
| 2006/0265664 A1* | 11/2006 | Simons | ................. | A62B 99/00 715/772 |
| 2006/0274070 A1* | 12/2006 | Herman | .................. | A63F 13/10 345/474 |
| 2007/0192739 A1* | 8/2007 | Hunleth | ................ | G06F 3/0481 715/823 |
| 2008/0136817 A1* | 6/2008 | Dederichs | ............... | G06T 15/00 345/426 |
| 2008/0228904 A1 | 9/2008 | Crespo-Dubie et al. | | |
| 2009/0045939 A1* | 2/2009 | Holland | ................ | H04W 24/00 340/524 |
| 2010/0013842 A1* | 1/2010 | Green | ................... | G06T 15/005 345/522 |
| 2010/0095236 A1* | 4/2010 | Silberstein | .............. | G06T 13/00 715/781 |
| 2011/0010633 A1* | 1/2011 | Richmond | .............. | H04L 41/12 715/736 |
| 2011/0258461 A1* | 10/2011 | Bates | .................. | G06F 11/1435 713/190 |
| 2012/0047107 A1* | 2/2012 | Doddavula | ....... | G06F 17/30575 707/620 |
| 2012/0169499 A1* | 7/2012 | Dubois, Jr. | ............ | G08B 13/26 340/562 |
| 2013/0073619 A1* | 3/2013 | Tumuluri | ................ | G06T 19/20 709/204 |

OTHER PUBLICATIONS

Decision of Final Rejection dated Dec. 18, 2017 in related Japanese application No. P2014-558922, filed Feb. 25, 2013 (English translation included).

* cited by examiner

| DATABASE / MEMORY REPRESENTATION | | | | | |
|---|---|---|---|---|---|
| NODEID | NODENAME | LOCATIONX | LOCATIONY | PARENTNODE | PAYLOADOBJECT |
| 1 | HOUSE | 0 | 0 | 1 | HOUSE |
| 2 | DOOR | 25 | 5 | 1 | DOOR |
| 3 | ALARM | 50 | 7 | 1 | ALARM |

*FIG. 2*

|  |  |  | << JAN 1, 2012 >> |  |  |  |
|---|---|---|---|---|---|---|
| SUNDAY | MONDAY | TUESDAY | WEDNESDAY | THURSDAY | FRIDAY | SATURDAY |
|  | 2 | 3 | 4 DENTIST OFFICE MTG | 5 | 6 | 7 |
| 8 | 9 | 10 | 11 | 12 | 13 | 14 |
| 15 | 16 | 17 | 18 | 19 | 20 | 21 |
| 22 | 23 | 24 | 25 | 26 | 27 | 28 |
| 29 | 30 | 31 | FEB 1 | 2 | 3 |  |

*FIG. 4*

ALL MAIL
   GMAIL
      GMAIL-1
      GMAIL-2
   YAHOO
   HOTMAIL
INBOX
SENT
TRASH
PERSONAL

MAIL LISTING
FROM S@SWARGA.COM

EMAIL MODULE
DETAILS
A@MONS....COM

THAT'S AN INCREDIBLE....

*FIG. 9*

PERSISTENT NODE FRAMEWORK

BACKGROUND OF THE INVENTION

The generation, rendering and manipulation of computer graphics may involve the creation of visual objects/graphics on a computer screen using various pieces of computer software and hardware. Graphic designers may use graphics to create models and/or simulations of various types of real-life scenarios/situations by creating and/or importing digital images/pictures onto a background of their choice. The evolution of the Internet has included the ability of the browser to render graphical shapes and images that depict real-life situations in various graphical forms. End users may navigate the Internet seamlessly, using the browser's graphical user interface. However, shortcomings still remain as the information is stateless and lacks self-persistence.

The present invention overcomes these shortcomings by providing a robust and flexible mechanism to render any aspect of a computer model with persistence onto any graphical rendering surface of any computing device.

BRIEF SUMMARY OF THE INVENTION

The invention relates to a hierarchical, persistent and relational node framework, the capabilities of which include representing a modeled scenario on any graphical rendering surface on any computing device; retaining the context of the whole modeled scenario rendered on any graphical rendering surface on a client machine; tracking any user interaction on any rendered graphical surface via event(s) or system generated event(s) on the rendering surface using all forms of transforms or other instructions; applying transforms/changes to un-rendered data residing in memory and/or in the database; and persisting any and all modifications to the rendered and un-rendered node framework in memory or in a database or file system, locally on a computing device and/or in a cloud distributed infrastructure.

BRIEF DESCRIPTION OF DRAWINGS

The accompanying drawings, which are included to provide a further understanding of the invention and are incorporated in and constitute a part of this specification, illustrate exemplary embodiments of the invention that together with the description serve to explain the principles of the invention.

FIG. 2 represents the database schema and representation of a node in a memory table or in a database or file system, either one of which could be cloud enabled.

FIG. 4 represents a cloud enabled calendar created with a node framework embodiment of the present invention.

FIG. 7b is a representation of the server stack.

FIG. 9 represents an image of an email client rendered on Canvas using a node framework embodiment of the present invention.

DETAILED DESCRIPTION OF THE INVENTION

Figure 1:
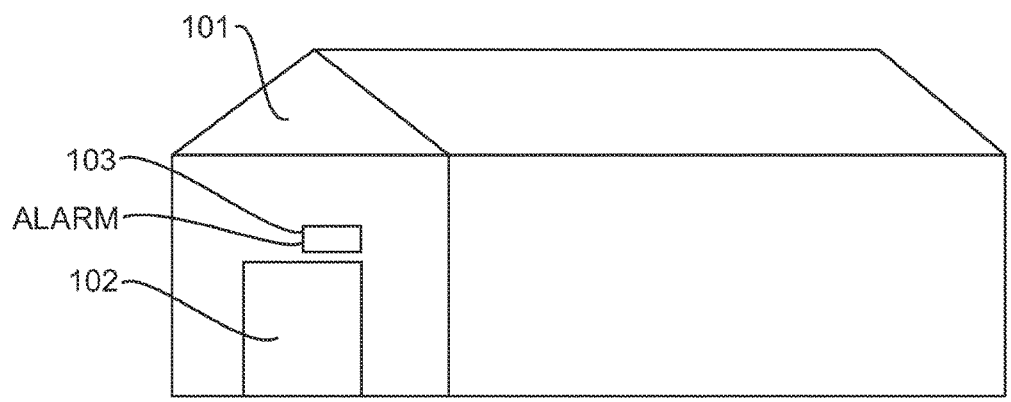
FIG. 1 is an example of a rendering of a small single-family house.

The present invention is not limited to the particular methodology, compounds, materials, manufacturing techniques, uses, and applications described herein, as these may vary. The terminology used herein is used for the purpose of describing particular embodiments only, and is not intended to limit the scope of the present invention. The singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer-to functional equivalents of such structures.

All patents and other publications identified are incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason.

The term "cloud events" refers to system events generated in the cloud that can be time based or based on user interaction with the system.

The term "layer" refers to a way of hiding the implementation details of a particular set of functionality.

The term "node" refers to an abstract model with its own attributes and a save method. A node may also have a compartment (in the form of object attribute) for holding a payload object. In the case of programming languages that do not support objects, a node may be the underlying mechanism or carrier to manipulate, maneuver, transform, translate, connect and/or embed various attached payload object components that can be rendered on any graphical surface or stored in memory or on a database as a data array.

The term "payload" refers to an object(s) added on or attached to a node(s).

The terms "transforms" and "transformations" refers to the graphical shape(s) embedded into a node(s) as a payload object(s). These graphical shapes may change their appearance on the canvas based on the changes to its attributes. These attributes are represented in an array and/or in a matrix format. The incorporation of changes to these attributes can be applied using the transform functionality of the matrix.

In various embodiments of the invention, the node is persistent, which refers to a characteristic of state or other configuration of information in a program or machine that outlives the process that created it. The persistence property of the node in these embodiments may be invoked in periodic intervals or on-demand, as needed. The node framework may instantly save changes to its payload objects and can call on them at any time. In this regard, the payloads persist along with the nodes in the database. Instead of a framework that uses a node as a base class from which other classes inherit tendencies or functionality, the framework of the present invention comprises a node that may be used as a carrier of various objects as payloads. This difference distinguishes the present invention from currently available libraries that make use of a node as a base class. While current libraries merely provide efficient graphic drawing functionality on graphical rendered surfaces, the present invention enables the retention and persistence of any graphic rendering surface for cloud computing driven collaborative applications.

By not inheriting specific node functionality, different object payloads can behave completely different from each other, which facilitates the designation of the node object as truly polymorphic. When two different objects are inherited from the same class, they will share some common functionality. However, in the present framework, nodes are capable of acting as a neutral third party linking adapters. Therefore, if objects were to be loaded as payloads onto the base/abstract node classes, they would be completely oblivious t one another, but by using one of the predefined relationships between the two nodes, the payloads can be interlinked and made to interact with another in myriad of ways on any rendered graphical surface.

Figure 8:
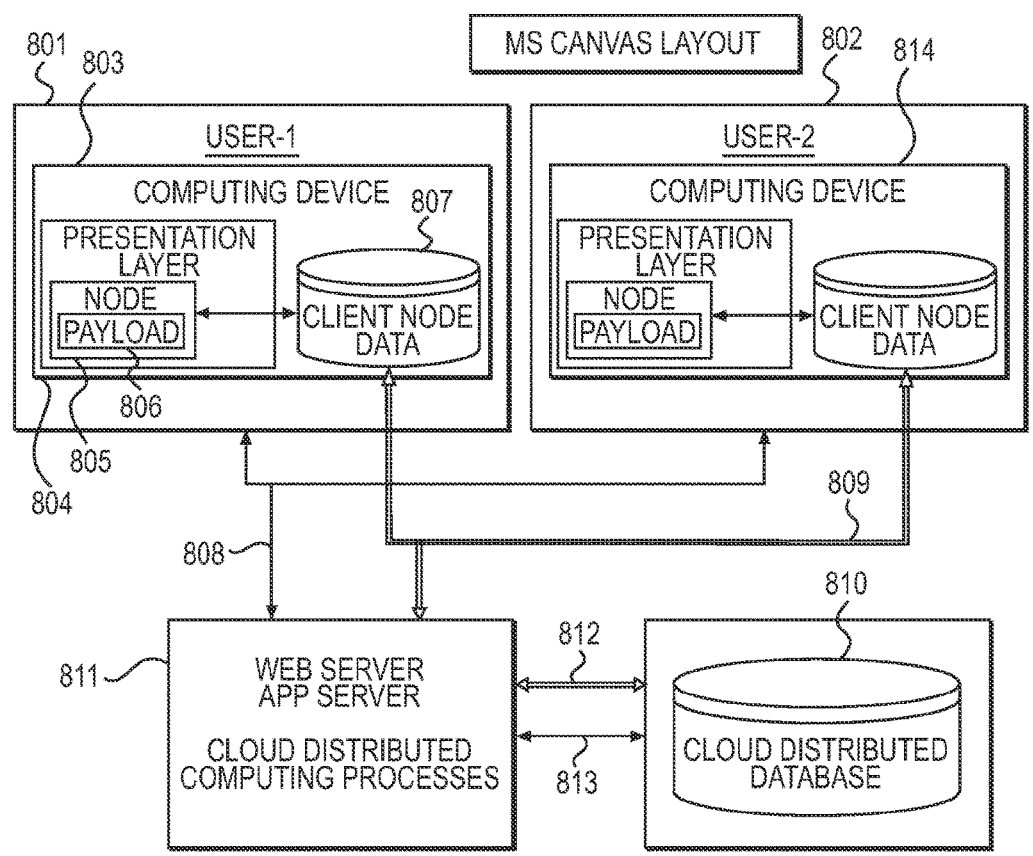
FIG. 8 represents a Canvas layout of the in-memory data representation of a client data node.

In addition to persistence, in an embodiment of the present invention, the node framework is capable of extracting and creating an in-memory array of a graphical mesh of nodes and payloads that persist in a local or cloud distributed database. This in-memory data representation of a graphic mesh is depicted in FIG. 8. FIG. 8 for demonstration purposes shows a single node (805) with its payload (806). This can easily be extended to multiple nodes in a single graphical representation. Applications could be built to apply various color masks to filter out details, while another application could be written to simulate a cascading effect of a moving a single object (potentially represented by a single node) out of thousands of objects located on other objects (or on the nodes or the payloads of the nodes representing the other objects), etc. A normal computing device (803) would be incapable of doing the necessary transformations of this kind or of this magnitude. A distributed cloud computing platform may perform these tasks, and by making use of the synch mechanism (809 and 812), the in-memory data array from a client data node (807) can be transferred over to a cloud computing platform (811). The cloud computing platform could then optimally apply transforms, manipulate the data and compute the results. The application would then store these computed results in a cloud distributed database (811) in addition to forwarding the necessary rendering components over to the computing device (803), which only has to render the results. The framework thereby allows the application of the massive computing power of the cloud to a device capable of only rendering Canvas or other graphical routines.

In an embodiment of the present invention, the node can be launched with none, one, two or more embedded object(s) add-ons as a payload(s). These payload objects (or functions that behave like objects as they exist in Javascript, since Javascript as a language does not comprehend objects), in turn, inherit all of the underlying properties of the node, including the persistence of the nodes in the database. Using the node as a carrier enables payload objects to have persistent properties and specialized functional routines of their own. In addition to the separate and distinct characteristics residing in the node, all of the inherent properties of node, such as hierarchal, peer relationships, groupings, etc., may be used.

Examples of a payload include, but are not limited to, graphical shapes on any graphical rendering surface (such as, for example, HTML5 Canvas), server machines in a cloud distributed network (identified by IP addresses), directories, files and folders in any computer operating system, folders from an email system, users in peer connected games, model representations of all physical objects as they may presently exist.

A node(s) may be configured with unique customized relationships with another node(s) at the time of creation or afterwards. The nature of the relationship will dictate how the given node or its embedded object payload affects the behavior of any associated node or its corresponding embedded object payload. This allows the node, depending on the type of object payload, to be polymorphic, thereby assuming various personalities.

Using a node as a container of payloads allows for a more flexible relationship between payloads of different types. The node acts as an impedance matching adapter. Without the use of the node as an adapter, trying to establish and act on these types of relationships would be difficult and cumbersome.

As an example, FIG. 1 represents the rendering of a small single-family house. Using graphical rendering of shapes, one would be able to draw a figure of the house as depicted in FIG. 1 from a parent node, house (101).

In the database, the data for the three nodes could be represented as in FIG. 2. Alternatively, using advanced native rendering routines of the payload objects, the application would render a high-resolution picture of the house; in this instance, the node would carry an additional payload in the form of an image, and the database would have an extra column for the image.

Figure 3:
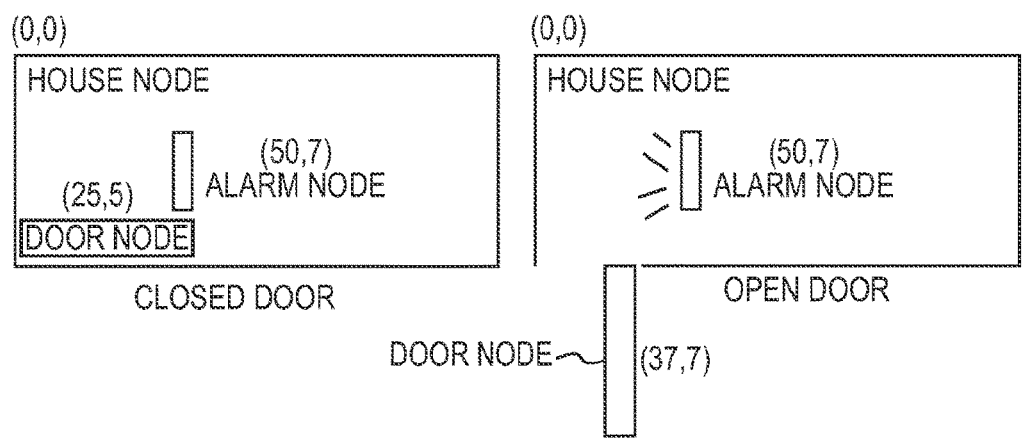
FIG. 3 depicts a graphically rendered surface of a house model simulation.

In the rendered form depicted in FIG. 3, one node would represent the whole house (301) with the house being a payload object in the abstract node, while another node would represent a door (302) of the house with the door being the payload object, while yet another node would represent a door alarm (303) with the alarm being a payload in an abstract node. With the node framework, the door and the alarm nodes may be embedded into into the house node. On a rendered surface, if the house node were to be moved in its physical location, the door and alarm nodes would move in conjunction with the house node based on the established relationship of the connected nodes. This interactive action and the consequent response can result in being able to use any application that converts graphical rendering shapes as a true platform for building mobile and desktop application for the cloud.

The door node may be connected with the alarm node through the use of a "node link" relationship. As shown in FIG. 3, on a graphically rendered surface in a model simulation, a user action can initiate the opening of the door, which would change the door (302) node's coordinates from (25, 5) to (37, 7). This would then trigger the alarm (303) node to change its state, which would then sound the alarm or change its color provided the rendering surface has the ability to do either. In this state, if the user were to call a save function, the save function call would propagate from the node containing house with its payload object house, then to its embedded nodes of door and alarm and their respective payload objects, door and alarm.

Currently, no existing framework allows for knitting together objects of completely different types as one cohesive unit with the ability to render it on a graphical surface in unison and with a seamless user interface, together with features like nested persistence propagation and in-memory transformations, such as a cloud enabled interactive calendar as shown in FIG. 4.

In FIG. 4, each graphic is a node representing various types of different payload objects. The final graphic is a picture of various inter-node (and their payload) relationships rendered on a computing device screen. As the user interacts with the calendar objects, those actions translate into one or more graphics represented by nodes in the figure. The nodes and payloads process various events such as: moving/dragging of a graphic from one point to another; changing the date and/or time on the graphic and in turn, the event; scrolling of the background panel for cells (again nodes with payloads) that have more events than what can be fitted for viewing through a single cell window; switching of months by clicking on arrows; and getting a list of months in a year by clicking on the month (in this case, February). These are merely some of the node interaction activities that can be accomplished in a fully functional calendar product.

Figure 5:
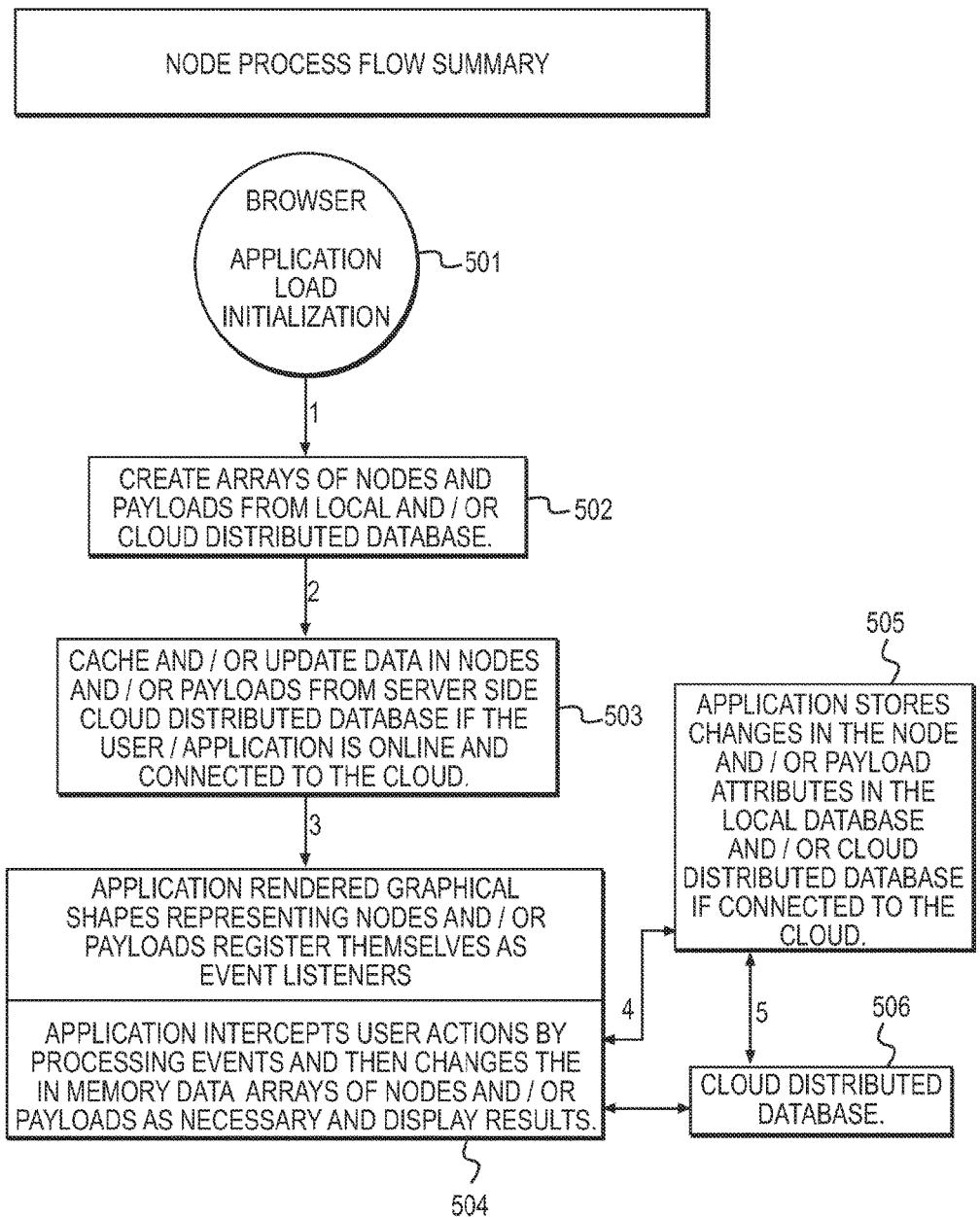
FIG. 5 shows a node process flow summary.
Figure 6:
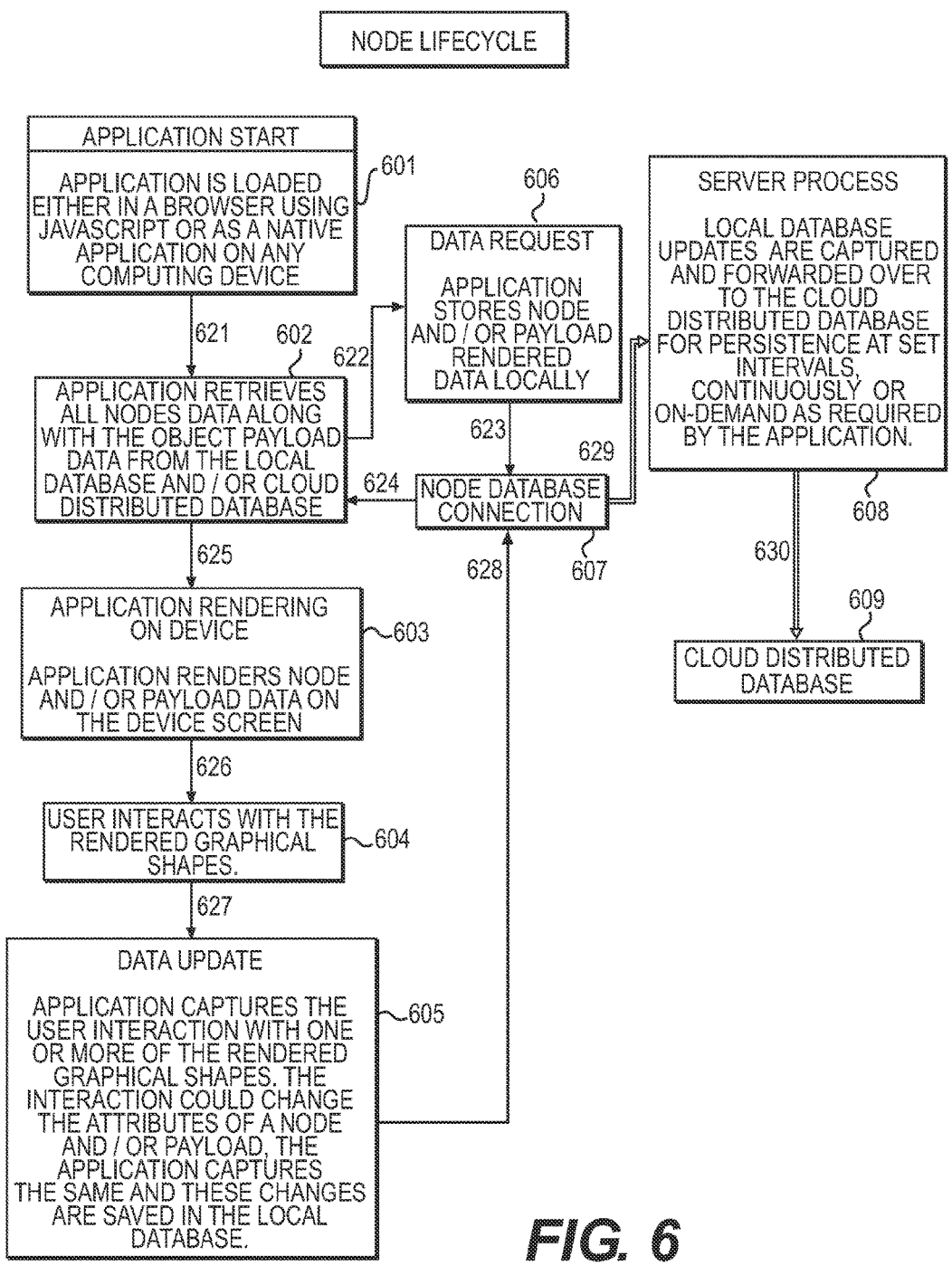
FIG. 6 depicts a node lifecycle.

The persistent and interactive node framework in an embodiment of the present invention is set forth as a five-step example in the node process flow summary shown in FIG. 5. Here, a node may be created and rendered from the application script using the values from the database. The database can be a local database on a client machine/ device or could be a cloud distributed database. As the user interacts with the graphic(s) nodes, all user interactive actions and all responses from the graphical shapes/nodes are captured and persisted in the database. In this example, on a fresh load-up, the application may be required to load the data in the local cache from the cloud distributed database using (629) from FIG. 6, which depicts a node lifecycle that may be an extra step in the node process flow.

Combining disparate objects together through nodes creates new possibilities for bringing application-level behavior to any rendering surface, in addition to creating more efficient and robust environments to present images and data elements. A current application of this adaptation in a browser would be the manipulation of passive or "dumb" graphics on a HTML Canvas through the use of nodes to make static and/or passive applications more interactive along with better user experiences as mobile or desktop applications for the cloud.

Applications can implement the framework in a stand-alone mode with a local database, with a cloud-enabled cloud distributed database (such as that described in U.S. patent application Ser. No. 61/514,243, which is hereby incorporated by reference in its entirety), or in a hybrid of the preceding two approaches. If used, cloud persistence allows user initiated or system generated event related interactive changes to be persisted in the cloud and to be simultaneously transmitted to any and all selected devices connected to the cloud. This feature enables the creation of true collaboration between mobile and desktop applications. This process is depicted, for example, in FIGS. 6 and 8.

Figure 7:
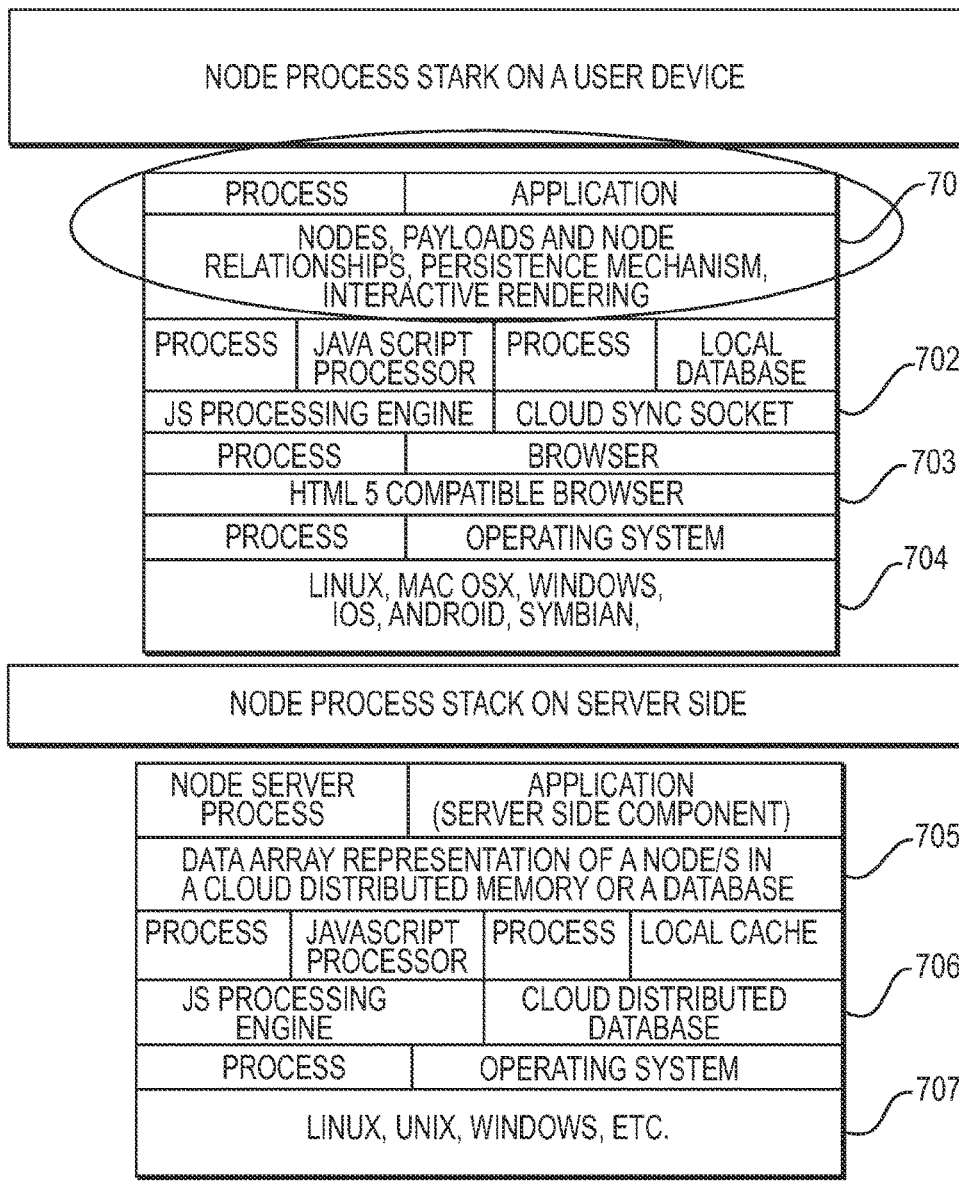
FIG. 7 represents two process detail stacks. The node framework depicted in FIG. 7a represents an example using nodes on Canvas in an HTML5 browser.

In another embodiment of the present invention, a hybrid configuration, the program utilizes a unique client server architecture wherein two separate databases interact with programs. As shown in FIG. 7, one of the databases resides on the client side in the temp space of the browser (in one configuration) (702), while the other side resides on the backend server side that is cloud distributed (706). These databases, depending on the needs of the application, can periodically coordinate updates with one another by using any one or a combination of the following techniques: user interaction, polling, database replication initiated from backend server process or cloud based event mechanism. Program scripts can update the node and its payload information and, in turn, the visual aspect of any rendered images and its contents on a real-time basis for clients without any user input.

In yet another embodiment of the present invention, as depicted for example in FIG. 8, the client native application that runs on a mobile device will have direct connection to the cloud distributed database storage (809 and 812). As an alternative, the application can make use of a local database, which then can either be continuously synched up with a backend cloud distributed database or be synched at set intervals or on demand. This is also depicted, for example, in FIGS. 6 (629 and 630).

In another embodiment of the present invention, as depicted, for example, in FIG. 9, an email client may be rendered on Canvas using the node framework. The leftmost panel can be used to represent a directory and/or a file structure of any file system, local or remote.

As depicted, for example in FIG. 5, node lifecycle and layout may either store all of the attributes of the graphics in a datastore and then render the graphics on any graphic rendering surface, or render the graphics and then subsequently store all attributes of the associated graphics in a database. Each instance in which the attributes are stored may constitute a node. This allows a whole rendering surface containing multiple graphics to be stored in and rendered on demand from device memory, the local or the cloud datastore. The datastore can be a local database on the device where the browser resides, attached to the web server that is rendering the page, or be a distributed file or a database in the cloud; the datastore can also take the form of a combination of databases as in a hybrid mode. The system stores aspects and attributes of any rendering surface in the form of data bytes in a local database or the cloud based database, which is essentially an un-rendered in-memory node array. Applications can send this in-memory data array to a cloud computing platform for highly computational translational algorithmic processing. Upon completion, if enabled with a cloud distributed database, this un-rendered in-memory node array can then be used to replicate and update the copy of another in-memory node array with the database of another remote cloud connected device on the same or on a different physical network. This can facilitate a true collaborative feature between mobile and desktop applications.

By enabling nodes to render graphics on any graphic rendering surface with their native integrated and inter-relational properties, it is possible to allow the transmission of various user actions through either a keyboard, audio, mouse or a touch event on one of the graphical shapes that is mimicking the behavior of the modeled payload object on any rendering surface. These inter-graphic relationships via nodes are stored in a datastore and are cached within the graphic objects as they are accessed and referred to in the scripting language when they are rendered on any graphical rendering surface. All of the changes/transforms to the affected objects by user interaction and/or a system event are applied to object payloads that are stored within the nodes and/or are resident in memory. This allows for a fast response time and a solid and reliable user experience. These graphic objects representing the modeled payload objects within the node have the ability to declare themselves as event listeners for all types of events regardless of whether they are system or user generated. This facilitates the processing and propagation of events from these graphic objects declared as event listeners in a unique way using node relationships, that allows for the interaction between various graphics and/or the cloud infrastructure, thereby affecting the behavior attributes of any related node and/or its payload and in turn the rendering surface on the device being used to render the nodes. In effect, dynamic attributes are assigned to static graphical shapes depicting real life models or simulations, without incurring any additional cost of re-rendering the nodes and their payloads. This eliminates the biggest obstacle for using most commonly used graphical surfaces such as Canvas, wherein the whole canvas has to be re-drawn if there is any change in one of the pixels of the graphical shapes, since these graphical surfaces by themselves, do not have the ability to remember context. In embodiments of the present invention, all rendering surfaces, including Canvas, are enabled to be used as mainstream building blocks in developing new generation of interactive mobile and desktop applications because they now have the ability to retain context.

Current graphical rendering surfaces lack the functionality related to the persistence of graphical shapes in any datastore, let alone in a datastore that is cloud distributed. Using a node relationship mechanism as disclosed here, and then embedding separate and unique types of objects within each node as payloads, allows this process to control all attributes related to the graphical shapes on any graphical rendering surface. The node relationships also allow coordinated, as well as, isolated behavior of graphical shapes on any given graphical rendering surface. The object payloads in turn make use of the persistence property of the nodes, thus making all modifications and graphical shape attributes permanently persistent for even the slightest of movements. The relative position of a node or the underlying payload shape can be further categorized into various forms to achieve different interactive behavioral patterns. In storing nodes in this relational manner, unique fields are created, namely inherent node levels, node display status and node status, which facilitate a new approach to storing and retrieving row-based data from a database.

A node level allows for the creation of an offset/indent/depth for graphical objects during the rendering of the graphics on any rendering surface. Node display status allows for the displaying or hiding of the node and its related attributes during rendering. Node status allows for the designation of a particular node as either active or passive, which can be used to make the node interactive or static during and after the rendering of the graphical shape on the rendering surface for any system or user based event processing.

Upon retrieving data and using the node relationship mechanism, the scripts create a mesh of nodes for a relationship that can be a hierarchical tree, a parent-child node, peer nodes, embedded nodes or a parent clone, etc. This node relationship is then stored for future rendering/transformations/modifications use in a datastore. These relationships can be terminated or adjusted dynamically at any time. In retrieving this mesh of nodes for rendering on any graphical surface, the graphical shapes can be activated, repainted, cleared, repositioned, reoriented, deactivated, restored to its initial state or a previous state, dragged or dragged and dropped efficiently onto other shapes or in other locations. Using the node relationship, the associated graphical shapes can be made to drag or to stay stationary based on user interaction with other graphical shapes on any graphical rendering surface. Graphical shapes will move in coordination with a mouse pointer, audio input or a screen touch through a user interaction or a system-generated event. Associated shapes can demonstrate various kinds of behavior based on their unique embedded payloads and inter-node relationships. The node acted upon by the user or the system event transmits a message for a transform/change to all of its associated/connected/linked/embedded nodes that are bound to it via some sort of a relationship. Since these transforms/changes are applied to associated nodes and/or their payloads in memory, the graphical shapes respond efficiently for a good user experience. This behavior can resemble a change of shape, a change of orientation shape, a change in color or the dimension of the shape, activation or deactivation, etc.

The relationship between two nodes can be configured at the time of node creation or at any later point in time. The types of relationships that nodes can establish include, but are not limited to, attached nodes where two nodes are attached but have no interaction with each other, and thus, are oblivious to the other's behavior, but can access each other and send messages to one another; hierarchical nodes where nodes are arranged in a hierarchical tree relationship and where there is no limit on the level of hierarchy; peer connected nodes where nodes reside on the same level and behave in lock step with one another; embedded nodes where one or multiple nodes are embedded within each other and where the activity of an embedded node is confined to the activity of the parent node within which they are embedded.

Boundaries can be of various types, such as physical boundaries on a canvas, physical limits in a chemical experiment, finite boundaries in a financial services software application with upper and lower bounds, etc. This type of relationship can be used to force the embedded node payload object scroll within either the outside of the boundaries of the parent or only outside of it.

Parent clone nodes resemble peer connected nodes except for the independent nature of each node in relation to the other. However, with this type of node, a broadcast messages can propagated to all related nodes with a single broadcast. Further, related node behavior can be controlled with a single message broadcast.

In an embodiment of the present invention, payload switching may allow a node to switch its payload from one object to another object of the same kind (class/function type) and/or switch the payload to a new type of object that is different from its original payload type. This allows a node to switch its behavior based solely on the payload. As such, sometimes changing the relationship between nodes can affect the behavior of the various nodes.

The various embodiments of the system of the present invention may capture the relationships between two or more nodes in different forms within each node. The relationship captured in the form of node and payload attributes allows for various transformations/changes to be applied to nodes in a relationship directly. Since these relationships and the references are captured in the form of arrays or collections, they reside in memory and allow for extremely fast propagation of changes/transform from one node to one or many other nodes. Without the node based framework, any application or system would have to create individual relationships between the nodes and thereby further complicate the intercommunication between shapes, making it extremely difficult to create a mesh of interacting graphics on any graphical rendering surface.

The ability to launch nodes as a payload within another node iteratively, such as nested or embedded nodes, creates the ability to use nodes as adapters of sorts between payloads of the same or different types. The nodes act as translators facilitating the interaction between the same and different types of nodes, thereby making the interaction and relationship between the attached payloads flexible as opposed to rigid. This flexibility and adaptive relationship creates benefits such as, more efficient interactive rendering of graphical shapes on any graphical rendering surface, grouping of payload objects, coordinated modification of payloads, coordinated movement of selected payloads in a group, transmission of attribute changes to the database for a payload of selected objects, etc.

The ensuing description provides embodiments only, and is not intended to limit the scope, applicability, or configuration of the invention. Rather, the ensuing description will provide those skilled in the art with an enabling description for implementing the embodiments. It should be understood that various changes may be made in the function and arrangement of elements without departing from the spirit and scope of the claims. For example, the present invention is contemplated to find application with social networking, client/customer management and service, financial and business services, health care records management, transactions management, sales, marketing, analytics, security threats, intelligence gathering, and collaboration.

In an embodiment of the present invention, Canvas may be used in an HTML browser as the graphical rendering surface. The flexible node framework will incorporate the graphical rendering shapes on Canvas and utilize them as components of an interactive application. HTML 5 is a browser specification wherein graphics can be delivered natively by the browser. Using this method, the user experience is enhanced by eliminating the installation of plug-ins.

However, changes on the HTML5 Canvas element require the whole picture to be re-drawn. Using nodes with persistence, the various embodiments of the present invention would eliminate the need to redraw the whole canvas and all graphical shapes on that canvas. Instead, the program can be selective to a single graphical shape in some instances, and thus, can provide a way to design and create an interactive canvas that retains its context and state, bringing about a dramatic improvement in performance for interactive graphics and the replication of the same state of Canvas and all of its composition to all devices connected in the cloud. Some libraries have tried to overcome this problem by using techniques such as layers, etc., however, without context, persistence and the ability to refresh and update the graphic from the local database, these solutions becomes untenable.

Canvas may offer a richer graphical experience for users by providing a "fire and forget" model, which translates to an image that is described as a combination of pixels. A significant drawback of Canvas is that it does not remember the context and the graphical shape the program draws once the program finishes drawing the graphical shape. To combat this flaw, some open source libraries on the market draw shapes on Canvas using boundaries of shapes rendered and by using one or more layers, and then retain the dimensions of the graphical shape in a scripting program that renders the graphical shape. However, these libraries still lose the context and relationships once the applications shut down.

Scalable vector graphics (SVG) is another standard for drawing shapes in browsers that is based on vectors. Although SVG allows for some bitmap manipulation functionality, it remains inefficient for rendering graphics on various device surfaces.

When a user interacts with an Internet browser based canvas rendered on a screen, a transform (changes in attributes) can be created. Currently, some open source libraries provide this piece of functionality; however, certain embodiments of the present invention not only store these transforms in a memory or a database, but also make use of node relationships in the framework to apply these in-memory transforms to appropriate graphical shapes on a canvas while making these changes persistent in the local and/or cloud based database. In essence, with the present invention, application developers and end users may now have the ability to work with a (cloud persistent) canvas that is responsive to user actions for web-based and desktop applications. Presently some open source libraries provide functionality that allows for individual graphical shapes to be re-rendered, however, a persistent nature does not exist. The node framework of the present invention can be utilized to allow the re-rendering of shapes on a device in a persistent nature on a local database, as well as on the cloud.

Almost all of the existing libraries do not allow different types of objects to be embedded into their so-called containers, which in essence are layers. The reasoning for this type of coding is attributed to these libraries' primary goal of simply providing an efficient graphical drawing for the canvas. The present invention is broader and is meant to enable Canvas to be used as a foundation for building cloud enabled applications across multiple devices.

Whereas other approaches define a node as a superclass of a layer, group or a graphical shape, the nodes and node relationships of the present invention allow for further flexibility and functionality for the graphical shapes on a canvas and other rendering surfaces. An example is when a graphical shape moves from one parent to another within the same layer as opposed to different layers.

An example of the application of an embodiment of the present invention is launching graphical shapes with nodes. If the node payload is of a particular graphical shape type, then the node can be rendered on Canvas as a graphical shape. Once a node gets rendered on Canvas as a graphical shape, the graphical shape has access to all of the attributes of the node. The shape can be designated as a draggable shape along the x, y or z-axis or along all axes if desired, and can be declared as an event listener, listening for events generated by a user via a system generated event, such as standard mouse events, like a mouse drag, a mouse click, a mouse over, a mouse out, etc. Generally, these actions on an event listening shape are processed by a corresponding underlying library. These events are intercepted and passed onto the node objects. Interception of these events prior to native processing within the payload object allows us to customize the processing in a far more powerful, robust and efficient way than exists today. In some instances, without affecting the ability to efficiently process data, node functionality may be invoked post execution of native functions in the payload. The events captured in the nodes can affect the graphical shape by changing its attributes and then broadcasting or passing these messages to other nodes. The behavior of any connected nodes is based on the type of relationship that exists between nodes as well as the type of payload the node is carrying at the time of event processing.

Another example of the application of an embodiment of the present invention is graphical shapes on Canvas as the load object of the node. In the case of a graphical object being a payload for a given node, when you draw various graphical shapes on Canvas, the rendering is only temporary. Users are required to re-draw the canvas should the graphics take on a different form in terms of position, color, orientation, etc., even for a single pixel. Additionally, some of the graphical shapes may be associated with time, thereby having different attributes that are assigned dynamically based on timing.

Attributes (time related or functional factors) of the node are stored in the datastore. These attributes can be easily applied to the payload within the nodes using routines in the scripting language. Without the nodes providing these values, the program would have to start from scratch for all types of objects that can be loaded onto the nodes as payloads. The node framework, in addition to enabling Canvas to be a building block or the foundation for cloud enabled mobile and desktop applications, also speeds up the application and minimizes CPU usage. This is achieved because all of the attributes of the node and the payload object are cached locally and are inherently updated with information with the cloud backend.

Another example of the application of an embodiment of the present invention is the use of a hierarchical pattern in rendering expandable and collapsible tree like graphics on Canvas. This hierarchical tree can be used in a myriad of ways to graphically represent various types of object payloads in various forms on Canvas.

With respect to directory structure, as part of the application, a cloud based storage vault for users may be provided. Users can elect to store their personal documents in this vault. The vault will have its own directory structure and file system that is distributed in the cloud. This directory and file structure will be presented to the end user on a canvas in the form of a storage cabinet with drawers and folders. The hierarchical node tree/relationship may be used in depicting the physical layout of the information in the form of rendered graphical shapes resembling drawers, folders and files. The file and folder structure of a directory listing from any operating system, including but not limited to, a cloud distributed file system can be depicted on Canvas using the node framework.

With respect to email-folder structure, as depicted in FIG. 9, for example, node structure can be used to depict the file folder management of a CRM system, which includes items such as, Email, Tasks, Events, Meetings, Chats, Daily Activities, etc. In addition to the normal activity that occurs in these processes, the cloud based directory structure and the node structure can be used to create a graphic depiction of the whole directory and file structure for document archiving and management similar to the directory structure described earlier.

With respect to business process modeling, the hierarchical node trees can also be used to represent a business related organizational chart with department and/or managerial hierarchies. Nodes can take the form of any relationship such as, parent-child, peer-connected, embedded, etc.

With respect to the gaming industry, the interaction of related nodes and their embedded object payloads along with the drag and drop functionality of graphical shapes allows the creation of new and uniquely interesting interactive games on any graphic rendering surface. As depicted in FIG. 8, for example, real-time game interaction between two human player(s), User1 (801) and User2 (802) or a human(s) and a computer can be depicted seamlessly. Essentially, the graphic processing would be carried out on powerful cloud distributed servers (811), while the results transmitted in the form of computed node(s) (805) and their payload(s) (806) would be the event generator(s) or graphical transformations on the client database side (807). The result would be faster load times and less CPU usage on the client end (803). The rendering surface on the user device would depict all of the nodes and their payloads using their native rendering methods in addition to the rendering methods of the node with persistence. The device (803) on which the associated graphics are rendered will have a localized cached copy (807) of the persistent attributes of the node and its payload. Additionally, the cloud based infrastructure (810) on the backend server would maintain a non-rendered replica of the user screen in-memory and would perform all of the heavy lifting of computational processing. Upon completion of the very large and complex computational task request from the client device on the server side, the system will update the data in the server side database (810). Through this coordinating mechanism, the computational results from the server side database would be transmitted over to the client side database cache (807). This would in turn render these results in the form of graphical changes to the graphics on the device's graphical rendering surface. In essence, the massive computational power of the cloud computing infrastructure for processing complex graphical interactions is brought to any device capable of rendering Canvas in a browser or any other graphical rendering surface, thus providing robust and powerful computational processing to the end user.

With respect to collaborative applications, the example depicted in FIG. 8 shows the following. Two devices (803 and 814), are connected to the cloud and load the same application with a single dataset. In this case, an application on each device would make a local copy of the data (807) related to the node(s) (805) and its payload(s) (806); it would then render the associated graphics on both devices (803 and 814), or only on the target device (814), at the same time or at different times. A user on one of the devices may interact with Canvas and change the attributes of one of the graphical shapes and/or nodes. This change will be stored in the local database by the application while also being transmitted over to the backend cloud distributed database through a coordination mechanism. Since other devices are connected to the same cloud distributed database, the change transmitted by the first device would then be transmitted through the cloud distributed database over to a second device. The application running on the second device would receive the changes and store same in the local copy of the database. If the device at the time of receipt of this change is running, the canvas would change its appearance in real-time. In essence, through this process, the embodiment of the present invention has transmitted changes to canvas on one device via the cloud to another device in real time, thus creating a true collaborative application. This functionality is not limited to simply two devices but can be extended to an unlimited number of devices connected to the cloud, as well as to any other graphical rendering surfaces other than Canvas.

A system, such as a local system, can be any computer, server, mobile technology computing device, or the like. The system can include a display, an input/output device, one or more processors, and one or more memories. The one or more processors are capable of processing instructions for execution within the system. For example, the one or more processors can process instructions stored in the one or more memories or cloud distributed database to display graphical information on the display. The one or more processors can be single-threaded processors or multi-threaded processors. The one or more memories can include, for example, volatile or non-volatile random access memory ("RAM") and/or read only memory ("ROM"). The components within the system can communicate through an internal bus.

Embodiments of the present invention described herein are exemplary only. One skilled in the art may recognize variations from the embodiments specifically described herein, which are intended to be within the scope of this disclosure. As such, the invention is limited only by the following claims. The present invention covers such variations provided that they come within the scope of the appended claims and their equivalents.

I claim:

1. A process for managing a plurality of data nodes in a class library framework, comprising:
    receiving, by an application on a local system from a cloud distributed database, the plurality of data nodes and a plurality of payloads,
    wherein each of the plurality of data nodes contains a payload,
    wherein the payload comprises at least one of a graphical shape of a graphical rendering surface, a server machine in a cloud distributed network, a directory, file, or folder in a computer operating system, a folder from an email system, a user in a peer connected game, and a model representation of a physical object,
    wherein each of the plurality of data nodes can switch its payload from one object to another object of the same or different kind,
    wherein each of the plurality of data nodes at least one of manipulates the payload, maneuvers the payload, transforms the payload, translates the payload, connects to the payload, and embeds object components attached to the payload that are capable of being rendered on a graphical surface,
    wherein at least one of the plurality of data nodes is a persistent node, the persistent node and its payload persisting in the cloud distributed database, and
    wherein another of the plurality of data nodes has a predefined relationship with the persistent node, the predefined relationship dictating a behavior of the another node and the persistent node or that of their payloads;
    extracting, by the application on the local system, the payload associated with each of the plurality of data nodes;
    computing, by the application on the local system, a displayable output based on the extracted payload associated with each of the plurality of data nodes; and
    enabling display, by the application on the local system, of information based on the extracted payload associated with each of the plurality of data nodes.

2. The process of claim 1, further comprising:
    receiving an initialization of the application on the local system;
    creating, in response to the initialization of the application on the local system, the plurality of nodes; and
    storing the plurality of nodes.

3. The process of claim 2, wherein:
    creating the plurality of nodes comprises creating, on the local system, the plurality of nodes; and
    storing the plurality of nodes comprises storing, on the local system, the plurality of nodes.

4. The process of claim 2, wherein:
    creating the plurality of nodes comprises creating, on the cloud distributed database connected to the local system, the plurality of nodes; and
    storing the plurality of nodes comprises storing, on the cloud distributed database connected to the local system, the plurality of nodes.

5. The process of claim 1, wherein the persistent node outlives a process that created the persistent node.

6. The process of claim 5, wherein the persistent node outlives the application on the local system.

7. The process of claim 1, wherein the payload associated with each of the plurality of nodes further comprises location information for the graphical shape to be rendered by the application on the local system.

8. The process of claim 1, wherein the predefined relationship of the other of the plurality of nodes with the persistent node comprises storing a reference to the persistent node in the other of the plurality of nodes.

9. The process of claim 1, further comprising:
    monitoring a processing event in the application on the local system;
    updating, in response to the monitored processing event, the payload associated with at least one of the plurality of nodes; and
    storing the updated payload associated with the at least one of the plurality of nodes.

10. The process of claim 9, wherein the processing event is selected from a group consisting of a change of shape, a change of orientation, a change of color, a change of dimensions, an activation, and a deactivation.

11. The process of claim 1, further comprising receiving, by another application on the local system, another plurality of nodes, wherein at least one of the other plurality of nodes is the persistent node.

12. The process of claim 1, wherein the application on the local system comprises an HTML compatible browser.

13. The process of claim 1, wherein the plurality of nodes are attached nodes that are attached and do not interact with one another.

14. The process of claim 1, wherein the plurality of nodes are hierarchical nodes that are arranged in a hierarchical tree relationship.

15. The process of claim 1, wherein each of the plurality of nodes is associated with an attribute.

16. A system comprising at least one processor connected to at least one memory, wherein the at least one processor is configured to:
    receive, by an application on a local system from a cloud distributed database, a plurality of data nodes and a plurality of payloads,
    wherein each of the plurality of data nodes contains a payload,
    wherein the payload comprises at least one of a graphical shape of a graphical rendering surface, a server machine in a cloud distributed network, a directory, file, or folder in a computer operating system, a folder from an email system, a user in a peer connected game, and a model representation of a physical object,
    wherein each of the plurality of data nodes can switch its payload from one object to another object of the same or different kind,
    wherein each of the plurality of data nodes at least one of manipulates the payload, maneuvers the payload, transforms the payload, translates the payload, connects to the payload, and embeds object components attached to the payload that are capable of being rendered on a graphical surface, wherein at least one of the plurality of data nodes is a persistent node, the persistent node and its payload persisting in the cloud distributed database, and wherein another of the plurality of data nodes has a predefined relationship with the persistent node, the predefined relationship dictating a behavior of the another node and the persistent node or that of their payloads;

extract, by the application on the local system, the payload associated with each of the plurality of data nodes;

compute, by the application on the local system, a displayable output based on the extracted payload associated with each of the plurality of data nodes; and enable display, by the application on the local system, of information based on the extracted payload associated with each of the plurality of data nodes.

17. A non-transitory memory storing a computer program, the computer program comprising one or more code segments that, when executed, cause at least one processor to:

receive, by an application on a local system from a cloud distributed database, a plurality of data nodes and a plurality of payloads, wherein each of the plurality of data nodes contains a payload, wherein the payload comprises at least one of a graphical shape of a graphical rendering surface, a server machine in a cloud distributed network, a directory, file, or folder in a computer operating system, a folder from an email system, a user in a peer connected game, and a model representation of a physical object, wherein each of the plurality of data nodes can switch its payload from one object to another object of the same or different kind, wherein each of the plurality of data nodes at least one of manipulates the payload, maneuvers the payload, transforms the payload, translates the payload, connects to the payload, and embeds object components attached to the payload that are capable of being rendered on a graphical surface, wherein at least one of the plurality of data nodes is a persistent node, the persistent node and its payload persisting in the cloud distributed database, and wherein another of the plurality of data nodes has a predefined relationship with the persistent node, the predefined relationship dictating a behavior of the another node and the persistent node or that of their payloads;

extract, by the application on the local system, the payload associated with each of the plurality of data nodes;

compute, by the application on the local system, a displayable output based on the extracted payload associated with each of the plurality of data nodes; and enable display, by the application on the local system, of information based on the extracted payload associated with each of the plurality of data nodes.

* * * * *